US011269648B2

(12) United States Patent
Hush et al.

(10) Patent No.: US 11,269,648 B2
(45) Date of Patent: Mar. 8, 2022

(54) APPARATUSES AND METHODS FOR ORDERING BITS IN A MEMORY DEVICE

(71) Applicant: Micron Technology, Inc., Boise, ID (US)

(72) Inventors: Glen E. Hush, Boise, ID (US); Aaron P. Boehm, Boise, ID (US); Fa-Long Luo, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/065,749

(22) Filed: Oct. 8, 2020

(65) Prior Publication Data

US 2021/0026644 A1    Jan. 28, 2021

Related U.S. Application Data

(63) Continuation of application No. 16/231,106, filed on Dec. 21, 2018, now Pat. No. 10,838,732.

(51) Int. Cl.
*G11C 7/10* (2006.01)
*G06F 9/38* (2018.01)
(Continued)

(52) U.S. Cl.
CPC .......... *G06F 9/3855* (2013.01); *G06F 9/3001* (2013.01); *G06F 9/30018* (2013.01);
(Continued)

(58) Field of Classification Search
CPC .. G06F 9/3855; G06F 9/3001; G06F 9/30018; G06F 9/30032; G11C 7/08; G11C 7/1006
(Continued)

(56) References Cited

U.S. PATENT DOCUMENTS 5,923,607 A    7/1999  Suh
5,986,918 A    11/1999 Lee
(Continued)

FOREIGN PATENT DOCUMENTS

CN        108713196 A    10/2018

OTHER PUBLICATIONS

International Search Report and Written Opinion from related international application No. PCT/US2019/066460, dated Apr. 14, 2020, 12 pages.

(Continued)

*Primary Examiner* — Viet Q Nguyen
(74) *Attorney, Agent, or Firm* — Brooks, Cameron & Huebsch, PLLC

(57) ABSTRACT

Systems, apparatuses, and methods for organizing bits in a memory device are described. In a number of embodiments, an apparatus can include an array of memory cells, a data interface, a multiplexer coupled between the array of memory cells and the data interface, and a controller coupled to the array of memory cells, the controller configured to cause the apparatus to latch bits associated with a row of memory cells in the array in a number of sense amplifiers in a prefetch operation and send the bits from the sense amplifiers, through a multiplexer, to a data interface, which may include or be referred to as DQs. The bits may be sent to the DQs in a particular order that may correspond to a particular matrix configuration and may thus facilitate or reduce the complexity of arithmetic operations performed on the data.

18 Claims, 6 Drawing Sheets

(51) Int. Cl.
*G06F 9/30* (2018.01)
*G11C 7/08* (2006.01)

(52) U.S. Cl.
CPC .............. *G11C 7/08* (2013.01); *G11C 7/1006* (2013.01); *G06F 9/30032* (2013.01)

(58) Field of Classification Search
USPC ........................................ 365/189.05, 230.06
See application file for complete search history.

(56) References Cited

U.S. PATENT DOCUMENTS

| | | | | |
|---|---|---|---|---|
| 5,991,230 | A * | 11/1999 | Urakawa | G11C 7/1072 365/189.09 |
| 6,188,624 | B1 | 2/2001 | Zheng | |
| 6,314,042 | B1 | 11/2001 | Tomishima | |
| 6,762,972 | B2 | 7/2004 | La | |
| 6,826,068 | B1 | 11/2004 | Shiga | |
| 7,280,427 | B2 * | 10/2007 | Shin | G11C 8/16 365/230.05 |
| 7,420,855 | B2 * | 9/2008 | Nakamura | G11C 7/1036 365/189.04 |
| 7,588,139 | B1 | 9/2009 | Campbell, III | |
| 8,081,522 | B2 * | 12/2011 | Murakami | G11C 16/04 365/189.05 |
| 8,131,897 | B2 | 3/2012 | Kim | |
| 8,509,020 | B2 | 8/2013 | Kajigaya | |
| 9,959,923 | B2 | 5/2018 | Zawodny | |
| 10,026,468 | B2 * | 7/2018 | Dally | G11C 11/4087 |
| 10,032,493 | B2 * | 7/2018 | Tiwari | G11C 7/1012 |
| 10,068,865 | B1 | 9/2018 | Finkbeiner | |
| 10,262,701 | B2 | 4/2019 | Zawodny | |
| 10,318,168 | B2 * | 6/2019 | Lea | G11C 11/4094 |
| 10,332,586 | B1 | 6/2019 | Hush | |
| 10,388,360 | B2 | 8/2019 | Hush | |
| 10,403,352 | B2 * | 9/2019 | Hush | G11C 5/025 |
| 10,418,092 | B2 * | 9/2019 | Zawodny | G11C 11/408 |
| 10,956,439 | B2 | 3/2021 | Crawford, Jr | |
| 2005/0036367 | A1 | 2/2005 | Merritt et al. | |
| 2007/0086243 | A1 | 4/2007 | Jo | |
| 2008/0126604 | A1 | 5/2008 | Kim | |
| 2008/0291746 | A1 | 11/2008 | Sunaga | |
| 2009/0180347 | A1 | 7/2009 | Kuriyama | |
| 2011/0205824 | A1 | 8/2011 | Kajigaya | |
| 2013/0091327 | A1 | 4/2013 | Shido | |
| 2015/0178246 | A1 | 6/2015 | Herrero et al. | |
| 2016/0306631 | A1 | 10/2016 | Vorbach | |
| 2017/0286112 | A1 | 10/2017 | Espasa et al. | |
| 2018/0246669 | A1 | 8/2018 | Redfern et al. | |
| 2018/0246855 | A1 | 8/2018 | Redfern et al. | |

OTHER PUBLICATIONS

First Office Action and Search Report from related Chinese patent application No. 201980084162.9, dated Oct. 13, 2021, 11 pages.

* cited by examiner

APPARATUSES AND METHODS FOR ORDERING BITS IN A MEMORY DEVICE

PRIORITY INFORMATION

This application is a Continuation of U.S. application Ser. No. 16/231,106, filed on Dec. 21, 2018, the contents of which are incorporated herein by reference.

TECHNICAL FIELD

The present disclosure relates generally to semiconductor memory and methods, and more particularly, to apparatuses and methods for ordering bits in a memory device.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can include a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of operations. Memory devices without logic for ordering information may contribute to increased latency, or may not ameliorate latency issues, associated with such arithmetic operations.

DETAILED DESCRIPTION

Figure 1:
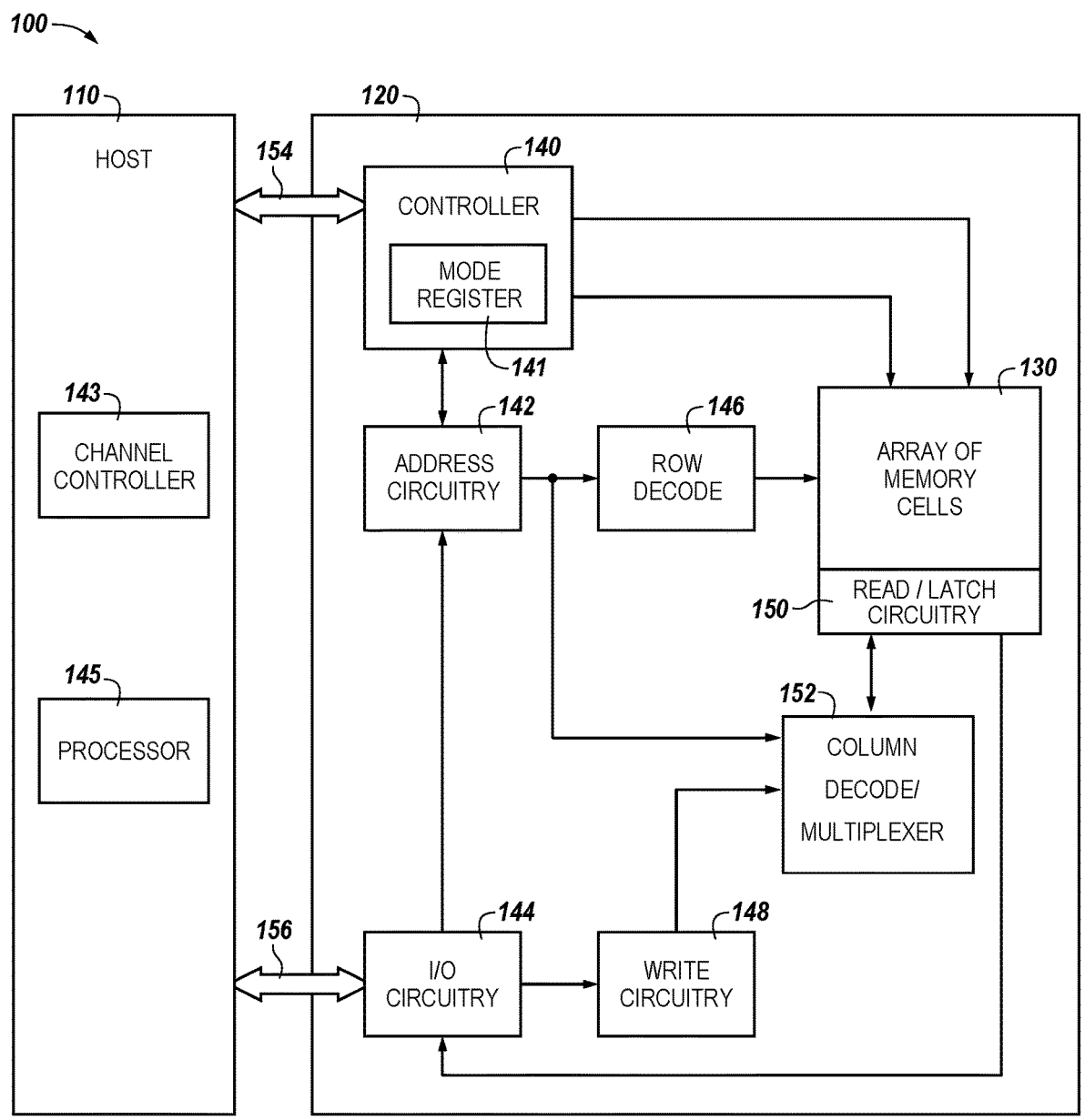
FIG. 1 is a block diagram of an apparatus in the form of a computing system including a memory device in accordance with a number of embodiments of the present disclosure.

The present disclosure includes systems, apparatuses and methods for organizing bits in a memory device. In a number of embodiments, an apparatus can include an array of memory cells, a data interface, column decode circuitry coupled between the array of memory cells and the data interface, and a controller coupled to the array of memory cells, the controller configured to cause the apparatus to latch bits associated with a row of memory cells in the array in a number of sense amplifiers and send the bits from the sense amplifiers, through column decode circuitry, to a data interface, which may include or be referred to as DQs. The bits may be sent to the DQs in a particular order that may correspond to a particular matrix configuration and may thus facilitate or reduce the complexity of arithmetic operations performed on the data.

A number of components in a computing system may be involved in providing instructions to the functional unit circuitry for execution. The instructions may be executed, for instance, by a processing resource such as a controller and/or host processor. Data (e.g., the operands on which the instructions will be executed) may be written to and/or stored in an array of memory cells that is accessible by the functional unit circuitry. In many instances, the processing resources (e.g., processor and/or associated functional unit circuitry) may be external to the array of memory cells, and data is accessed via a bus between the processing resources and the array of memory cells to execute a set of instructions.

In some instances, data is transferred from memory cells by the processing resources in the order that the data is stored in the array of memory cells. Accessing the data in this manner may reduce throughput (e.g., rate and/or efficiency) from the array of memory cells to the processing resources because the processing resources may need to reorder, organize, or otherwise manipulate the data before instructions can be executed on the data. The reduced throughput to the processing resources may reduce the overall performance of the computing system.

In a number of embodiments of the present disclosure, bits of data can be ordered by circuitry coupled to an array of memory cells prior to the processing resources executing instructions on the data. In some cases, a controller coupled to the array of memory cells directs the circuitry to send the bits of data to the DQs in a particular order for transfer to the processing resources. The particular order that the bits of data are sent to the DQs and transferred to the processing resource can be requested via a command from the processing resource and can configure the data in a particular matrix configuration for processing by the processing resource. In some embodiments, the circuitry can include column decode circuitry, that includes a multiplexer, for example, that selects and sends data from sense amplifiers to the DQs in a particular order. The particular order can be based on a command from a processing resource and/or a controller on a memory system. For example, data transferred from the array of memory cells to sense amplifiers may be sent from the sense amplifiers to the DQs via column decode circuitry (e.g., a multiplexer) in a particular order. The particular order may include bits sent from groups of adjacent sense amplifiers or may include bits sent from groups of sense amplifiers that are separated from each other by a particular number of sense amplifiers.

Also, bits of data received by the DQs may be written to the sense amplifiers via the column decode circuitry in a particular order. The particular order may include writing bits of data to groups of adjacent sense amplifiers or may include writing bits of data to groups of sense amplifiers that are separated from each other by a particular number of sense amplifiers. The bits of data sent from the sense amplifiers to the DQs via the column decode circuitry and/or sent from the DQs to the sense amplifiers via the column decode circuitry in a particular order can correspond to rows, columns, and/or diagonals of a matrix. In a number of embodiments, the particular order in which bits of data are sent by the column decode circuitry to the DQs and/or sense amplifiers can be based on the number DQs on a memory system and/or a burst length of a memory system which can be variable.

Transferring data from the array of memory cells to and/or writing data to the array of memory cells in the manner described above may reduce the number of steps typically carried out by the processing resource. Thus, a number of embodiments of the present disclosure may provide various benefits including improved throughput (e.g., increased speed, rate, and/or efficiency) associated with accessing (e.g., reading, writing, etc.) data values stored in the array of memory cells.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more of such things. For example, a number of memory devices can refer to one or more of memory devices. Additionally, designators such as "M", "N", "X", and "Y", as used herein, particularly with respect to reference numerals in the drawings, indicates that a number of the particular feature so designated can be included with a number of embodiments of the present disclosure.

The figures herein follow a numbering convention in which the first digit or digits of a reference number correspond to the figure number and the remaining digits identify an element or component in the figure. Similar elements or components between different figures may be identified by the use of similar digits. For example, 130 may reference element "30" in FIG. 1, and a similar element may be referenced as 230 in FIG. 2. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an apparatus in the form of a computing system 100 including a memory device 120 in accordance with a number of embodiments of the present disclosure. The system 100 may be a laptop computer, tablet computer, personal computer, digital camera, digital recording and playback device, mobile telephone, personal digital assistant (PDA), memory card reader, interface hub, sensor, autonomous or semi-autonomous motor vehicle, autonomous or semi-autonomous manufacturing robot, or an Internet-of-Things (IoT) enabled device, among other systems.

In a number of embodiments, reading and/or writing data and associated commands may utilize a data path and timing in a DRAM device based upon pre-existing protocols (e.g., DDR3, DDR4, LPDDR4, etc.). As used herein, data movement is an inclusive term that includes, for instance, copying, transferring, and/or transporting data values from a source location to a destination location, such as from an array of memory cells to processing resources or vice versa. As the reader will appreciate, while a DRAM-style memory device is discussed with regard to examples presented herein, embodiments are not limited to a DRAM implementation.

In a number of embodiments, a row (e.g., as shown at 219 in FIG. 2 and at corresponding reference numbers elsewhere herein) of virtual address space in a memory device (e.g., as shown at 120 in FIG. 1) may have a bit length of 16K bits (e.g., corresponding to 16,384 memory cells or complementary pairs of memory cells in a DRAM configuration). Read/latch circuitry (e.g., as shown at 150 in FIG. 1 and at corresponding reference numbers elsewhere herein) for such a 16K bit row may include a corresponding 16K sense amplifiers (e.g., as shown at 306 in FIG. 3 and at corresponding reference numbers elsewhere herein) and associated circuitry formed on pitch with the sense lines selectably coupled to corresponding memory cells in the 16K bit row. A sense amplifier in the memory device may operate as a cache for a single data value (bit) from the row of memory cells sensed by the read/latch circuitry 150. More generally, a number of embodiments of the present disclosure includes read/latch circuitry 150 (e.g., sense amplifiers 306 and associated circuitry), which may be formed on pitch with sense lines of an array of memory cells. The read/latch circuitry and other data storage components described herein are capable of performing data sensing and/or storage (e.g., caching, latching, buffering etc.) of data local to the array of memory cells.

In order to appreciate the improved data movement techniques that are based on ordering bit using column decode circuitry, a discussion of an apparatus for implementing such techniques (e.g., a memory device 120 having these capabilities and an associated host 110) follows.

As shown in FIG. 1, the system 100 may include a host 110 coupled (e.g., connected) to a memory device 120. The memory device 120 includes an array of memory cells 130 and a controller 140, among the various other circuitry for organizing data in a matrix configuration and transforming data from a matrix configuration to a linear configuration, as shown and described herein. The host 110 may be responsible for execution of an operating system (OS) and/or various applications that may be loaded thereto (e.g., from the memory device 120 via the controller 140). The host 110 may include a system motherboard and backplane and may include a number of processing resources (e.g., one or more processors 145, microprocessors, or some other type of controlling circuitry) capable of accessing the memory device 120 (e.g., via controller 140) to perform operations on data values organized in a matrix configuration. The controller 140 also may, in a number of embodiments, include a number of processing resources for performance of processing operations. As further shown in FIG. 1, the controller 140 may include or may be coupled to a mode register 141. The mode register 141 may be directed by the controller 140 to be set in a particular setting that corresponds to a particular order in which bits of data are read from the sense amplifiers and/or written to the sense amplifiers. The system 100 may include separate integrated circuits or both the host 110 and the memory device 120 may be on the same integrated circuit. The system 100 may, for instance, be a server system and a high performance computing (HPC) system or a portion thereof. Although the example shown in FIG. 1 illustrates a system having a Von Neumann architecture, embodiments of the present disclosure may be implemented in non-Von Neumann architectures, which may not include one or more components (e.g., CPU, ALU, etc.) often associated with a Von Neumann architecture.

The controller 140 (e.g., control logic and sequencer) may include control circuitry, in the form of hardware, firmware, or software, or combinations thereof. As an example, the controller 140 may include a state machine, a sequencer, and/or some other types of control circuitry, which may be implemented in the form of an application specific integrated circuit (ASIC) coupled to a printed circuit board. In a number of embodiments, the controller 140 may be co-located with the host 110 (e.g., in a system-on-chip (SOC) configuration).

For clarity, description of the system 100 has been simplified to focus on features with particular relevance to the present disclosure. For example, the array of memory cells 130 may be a DRAM array, SRAM array, STT RAM array, PCRAM array, TRAM array, RRAM array, FeRAM array, phase-change array of memory cells, 3D Xpoint™ array, NAND flash array, and/or NOR flash array. The array of memory cells 130 may include memory cells arranged in rows (e.g., in a plurality of subarrays) and columns. The memory cells may be coupled to one another by access lines (which may be referred to herein as word lines or select lines) to form rows. Additionally, the memory cells may be coupled to one another by sense lines (which may be referred to herein as data lines or digit lines) to form columns. Although a single array of memory cells 130 is shown in FIG. 1, embodiments are not so limited. For instance, memory device 120 may represent a plurality of array of memory cells 130 (e.g., array of memory cells included in a number of banks of DRAM cells, NAND flash cells, etc.) in addition to a plurality of subarrays, as described herein. Accordingly, descriptions in the present disclosure may be made with regard to DRAM architectures by way of example and/or clarity. However, unless explicitly stated otherwise, the scope of the present disclosure and claims is not limited to DRAM architectures.

As further shown in FIG. 1, the memory device 120 may include address circuitry 142 to latch address signals provided over a data bus 156 (e.g., an I/O bus from host 110) by I/O circuitry 144 (e.g., provided to external ALU circuitry and to DRAM DQs via local I/O lines and global I/O lines) included within the memory device 120. As further shown in FIG. 1, the host 110 may include a channel controller 143. Status and exception information may be provided from the controller 140 of the memory device 120 to the channel controller 143, for example, through a control bus 154, which in turn may be provided from the channel controller 143 to host 110. Address signals may be received (e.g., from channel controller 143 or another host component) through address circuitry 142 and may be decoded via a row decoder 146 and/or a column decoder 152 to access the array of memory cells 130. Data may be sensed from the array of memory cells 130 by sensing voltage and/or current changes on sense lines (digit lines) using sense amplifiers (e.g., shown as read/latch circuitry 150 in FIG. 1). Data may be sensed from the array of memory cells 130 in sizes of 256 bits, 128 bits, 64 bits, among other possibilities. The read/latch circuitry 150 may include a number of sense amplifiers, as described herein, to latch a page (e.g., a row or a portion of a row) of data from the array of memory cells 130. The input-output (I/O) circuitry 144 may include data I/O pins to be used for bi-directional data communication with host 110 over the data bus 156 (e.g., a 64 bit wide data bus, a 128 bit wide data bus, a 256 bit wide data bus, etc.). The memory device 120 may further include write circuitry 148 that may be used to write data to the array of memory cells 130.

The controller 140 may decode signals (e.g., commands) provided by control bus 154 from host 110. The controller 140 may be configured to receive a command from the host 110 regarding ordering data sensed from the array of memory cells 130. For example, the controller 140 may receive a command to order the bits of data based on a matrix configuration and/or size. The controller 140 may control operations by issuing signals determined from the decoded commands from host 110. These signals may include chip enable signals, write enable signals, address signals (e.g., subarray address signals, row address signals, and/or latch address signals) that may be used to control operations performed on the array of memory cells 130, including data sense, data store, subarray addressing, row addressing, latch addressing, data move, data write, and data erase operations, among other operations. In various embodiments, the controller 140 may be responsible for executing instructions from host 110 and accessing the sense amplifiers for a prefetch operation or a write operation.

As further shown in FIG. 1, the memory device 120 includes a column decode circuitry/multiplexer 152. The controller 140 may be capable of directing circuitry such as the read/latch circuitry 150 to transfer data from the array of memory cells 130. In a number of embodiments, the controller 140 may direct the column decode circuitry 152 to send the data in a prefetch operation from the number of sense amplifiers to DQs via column decode circuitry 152 in a particular order. Additionally or alternatively, the controller may direct the column decode circuitry 152 to write data received by the I/O circuitry 144 to the read/latch circuitry 150 via column decode circuitry 152 in a particular order. The data may be received by the/O circuitry 144 via the data bus 156 from the host 110. The data can be written to the read/latch circuitry 150 in the particular order to prepare the data for a subsequent read operation that will request the data in a matrix configuration that corresponds to the particular order which the data was written to the read/latch circuitry.

Figure 2:
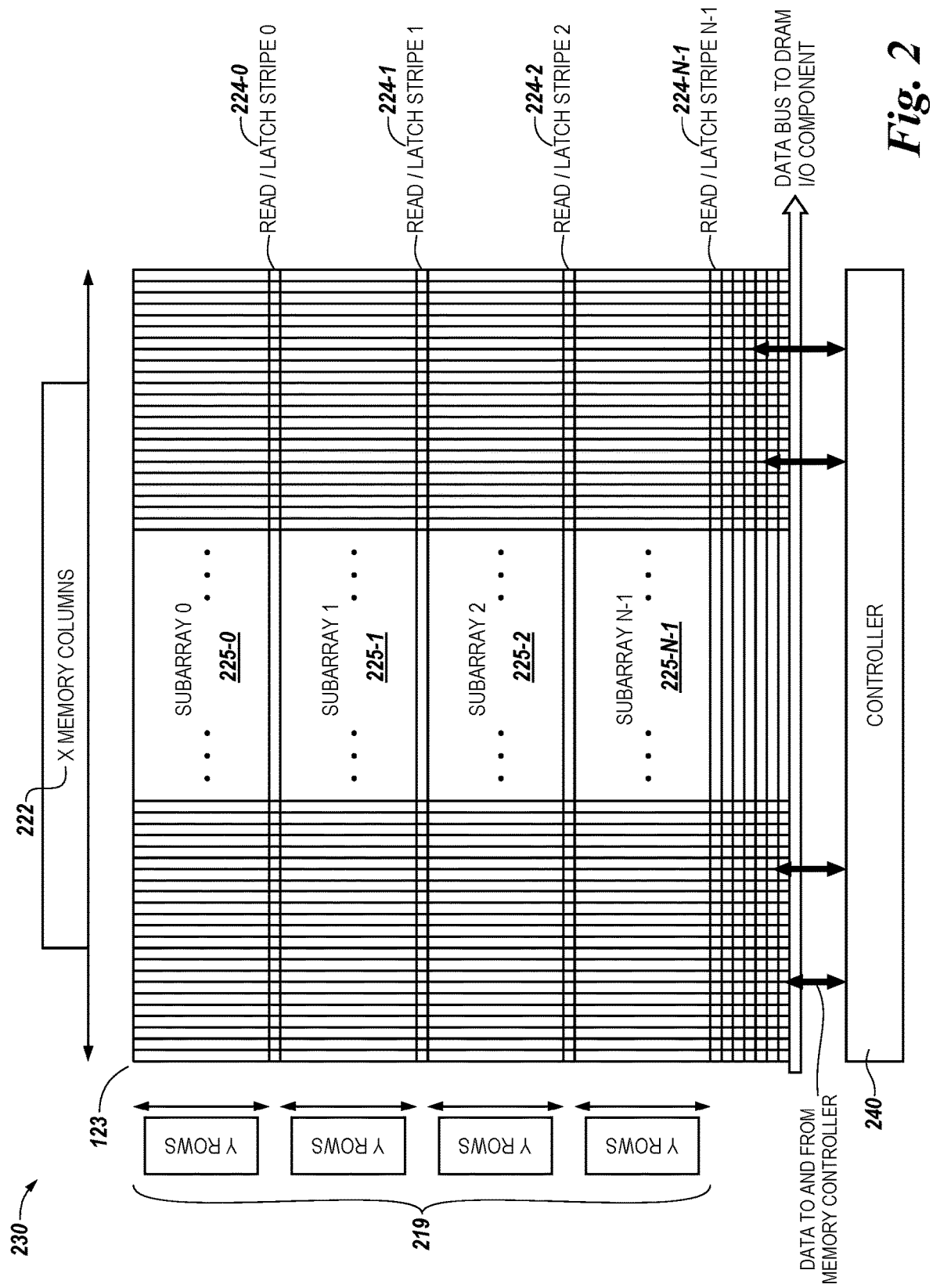
FIG. 2 is a block diagram of an array of memory cells of the memory device and a controller of the memory device in accordance with a number of embodiments of the present disclosure.

FIG. 2 is a block diagram of an array of memory cells 230 of the memory device and a controller 240 of the memory device in accordance with a number of embodiments of the present disclosure. The architecture of the array of memory cells 230 may include a plurality of columns (e.g., "X" columns 222 as shown in FIG. 2). Additionally, the array 230 may be divided into a plurality of subarrays 225-0 (SUBARRAY 0), 225-1 (SUBARRAY 1), . . . , 225-N−1 (SUBARRAY 225-N−1), which may be separated by respective amplification regions that may include groups (e.g., sets) of sense amplifiers. The groups of sense amplifiers may be referred to as sense amplifier stripes or read/latch stripes. For example, as shown in FIG. 2, each of the subarrays 225-0, 225-1, . . . , 225-N−1 has an associated read/latch stripe associated therewith (e.g., 224-0, 224-1, . . . , 224-N−1, respectively).

The array of memory cells 230 may include 64 subarrays, 128 subarrays, 256 subarrays, 512 subarrays, among various other possible numbers of subarrays. However, embodiments are not so limited, and some embodiments of an array of memory cells may have a different number of subarrays than just presented. In a number of embodiments, the subarrays 225 may have the same number of rows in each subarray (e.g., 256 rows, 512 rows, 1024 rows, 2048 rows, among various other possible numbers of rows). However, embodiments are not so limited, and at least some of a plurality of subarrays within the array of memory cells 230 may have different numbers of rows.

Each column 222 is configured to be coupled to read/latch circuitry (e.g., read/latch circuitry 150 as described in connection with FIG. 1 and elsewhere herein). As such, each column in a subarray may be coupled individually to a sense amplifier that contributes to a set of sense amplifiers (e.g., a read/latch stripe) for that subarray. For example, as shown in FIG. 2, the array of memory cells 230 may include read/latch stripe 0, read/latch stripe 1, . . . , read/latch stripe N−1, shown at 224-0, 224-1, . . . , 224-N−1, that each have read/latch circuitry with a set of sense amplifiers that may, in various embodiments, be used as registers, cache, and data buffering. The sense amplifiers (e.g., as shown at 306 and described in connection with FIG. 3) may be coupled to each column 222 in the subarrays 225-0, 225-1, . . . 225-N−1. Each of the subarrays 225-0, 225-1, . . . , 225-N−1 may include a respective plurality of rows (e.g., a respective group of "Y" rows 219). Each read/latch stripe 224-0, 224-1, . . . , 224-N−1 can be coupled to column decode circuitry/multiplexer (e.g., column decode circuitry/multiplexer 152 in FIGS. 1 and 352 in FIG. 3) which can be coupled to an I/O component (e.g., I/O component circuitry 144 in FIG. 1 and I/O component 344 in FIG. 3) to send data from the read/latch stripes to apparatus coupled to the array of memory cells 230.

FIG. 2 is a schematic diagram of a portion of a memory device in accordance with a number of embodiments of the present disclosure. FIG. 2 illustrates an example that includes 1T1C memory cells, in a folded DRAM configuration, that are each coupled to a sense amplifier 206. However, embodiments are not so limited, such that some embodiments may have memory cells in a 2T2C DRAM configuration.

Figure 3:
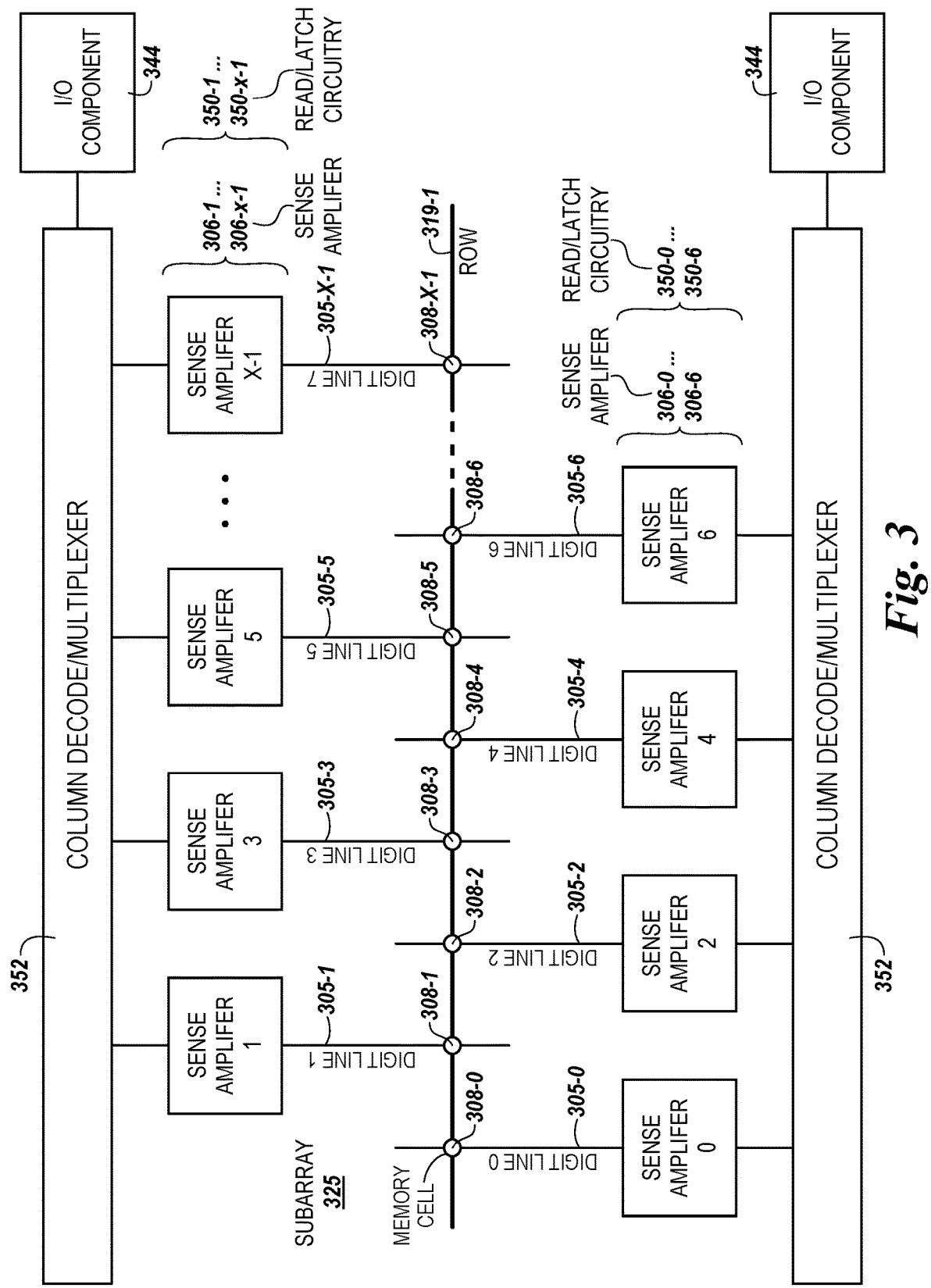
FIG. 3 is a schematic diagram illustrating a row of an array of memory cells in accordance with a number of embodiments of the present disclosure.

FIG. 3 is a schematic diagram illustrating a row of an array of memory cells in accordance with a number of embodiments of the present disclosure. As shown in FIG. 3, a portion of the subarray 325 includes a row 319-1 that may include a plurality of X memory cells 308-0 . . . 308-X−1. The memory cells 308-0 . . . 308-X−1 may be located at the intersection of a plurality of X digit lines 305-0 . . . 305-X−1 with the row 319-1. The plurality of digit lines 305-0 . . . 305-X−1 are referred to as DIGIT LINE 1 . . . DIGIT LINE X−1 in the illustration. The number X corresponds to a number of columns (e.g., the number of columns 222 shown in FIG. 2). As further shown in FIG. 3, the memory cells 308-0 . . . 308-X−1 may each be connected to associated read/latch circuitry 350-0 . . . 350-X−1, respectively. Each of the read/latch circuitry 350-0 . . . 350-X−1 includes a respective sense amplifier 306-0 . . . 306-X−1. The sense amplifiers 306-1 . . . 306-X−1 are referred to as sense amplifiers 1 . . . X−1 in the illustration. As illustrated, a sense amplifier associated with a memory cell is disposed between the memory cell and the column decode circuitry 352. The sense amplifier may be operated to determine a data value (e.g., logic state) stored in a selected memory cell. The sense amplifier 306 may include a cross coupled latch (not shown). The sense amplifier 306 may be coupled to equilibration circuitry (not shown), which may be configured to equilibrate the sense lines 305-1 and 305-2.

Each memory cell of the plurality of memory cells may include a transistor serving as an access element and a capacitor serving as a storage element. The number of data values (e.g., voltages) sensed from the memory cells (e.g., in activate operations) may correspond to the number of columns of memory cells that intersect a row of a subarray, such as row 319-1 of FIG. 3. For example, a total of X number of data values may be stored by the plurality of memory cells 308-0 . . . 308-X−1.

As further shown, the portion of the subarray 325 illustrated in FIG. 3 is connected to column decode circuitry 352. In particular, each memory cell is connected to the column decode circuitry 352 via a digit line associated with the memory cell and via a sense amplifier connected to the digit line, as shown. The column decode circuitry 352, in turn, is connected to an input-output component 344 that includes the DQs that transfer data from the memory system to a requesting device such as a processing resource and/or host. The I/O component 344 may be referred to as a data interface because it proves an interface or connection point to other components or device to facilitate an exchange of data. An architecture such as that shown in FIG. 3 allows the column decode circuitry 352 to read data stored in each memory cell and organize the data independent of reading data stored in other memory cells.

A controller (e.g., the controller 140 in FIG. 1) may be configured to receive (e.g., from host 110) coded instructions for performance of a data movement operation from the selected row of a subarray of the array of memory cells (e.g., a read, write, erase operation, etc.) and/or a compute operation (e.g., a logical operation, such as a Boolean operation, among other logical operations performed by a processor, such as processor 145 in FIG. 1) on a data value stored by a memory cell of the selected row. For example, the controller may be configured to receive a command for an operation that includes a request for performance of a DRAM operation (e.g., a DRAM activate, read, and/or write operation). The controller may be further configured to sequence or organize the data values of a row in a matrix configuration between the sense amplifier and an I/O component (e.g., the I/O circuitry 144 in FIG. 1) via column decode circuitry 352. The controller may direct column decode circuitry 352 and/or column select circuitry to organize the data values of the row in the matrix configuration. As such, the sense amplifiers described herein are configured to enable performance of memory operations and/or compute operations in connection with the selected row.

In a number of embodiments, bits of data corresponding from memory cells 308-0, . . . , 308-X−1 on row 319-1 can be latched in (e.g., temporarily stored in) sense amplifiers 306-1, . . . , 306-X−1. The bits of data can be transferred from sense amplifiers 306-1, . . . , 306-X−1 to I/O component 344 via column decode circuitry 352. Column decode circuitry 352 can transfer the bits of data from sense amplifiers 306-1, . . . , 306-X−1 in a particular order. For example, column decode circuitry 352 can transfer the bits of data in sequential order starting with the bit of data in sense amplifier 306-0 and ending with the bit of data in sense amplifier 306-X−1. The column decode circuitry 352 can transfer the bits of data corresponding to a matrix configuration. For example, column decode circuitry 352 can transfer 8 bits of data corresponding to a row, column, and or diagonal of matrix from corresponding sense amplifiers. The bits of data corresponding to a row of a matrix can correspond to every eighth sense amplifier of the sense amplifiers 306-0, . . . , 306-63.

Figure 4:
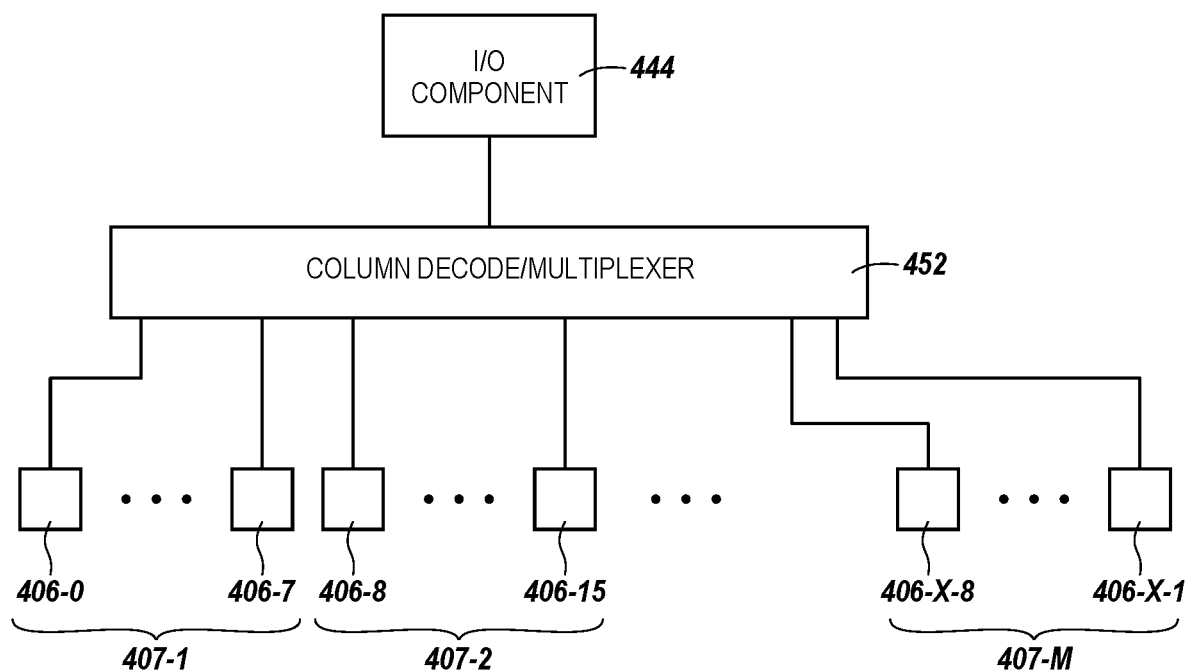
FIG. 4 is a block diagram illustrating an apparatus and method for transferring bits between sense amplifiers and I/O circuitry via column decode circuitry in a particular order in accordance with a number of embodiments of the present disclosure.

FIG. 4 is a block diagram illustrating an apparatus and method for transferring bits between sense amplifiers and I/O circuitry via column decode circuitry in a particular order in accordance with a number of embodiments of the present disclosure. In FIG. 4, sense amplifiers 406-0, . . . , 406-X−1 can store bits of data from a row of memory cells in an array of memory cells. The bits of data can be transferred from the row of memory cells and stored in sense amplifiers 406-0, . . . , 406-X−1 in response to an activate request. The column decode circuitry 452 can select bits of data from sense amplifiers 406-0, . . . , 406-X−1 to send the bits of data in a particular order to the I/O component 444 (e.g., a read operation). In the example depicted in FIG. 4, the column decode circuitry 452 can be configured to send 8 bits at time to the I/O component 444. Although, embodiments are not limited to 8 bits and any number of bits can be sent to the I/O component 444 at a time as part of a prefetch operation. For example, 8, 32, 64, and/or 128 bits, among other numbers of bits, can be sent to I/O component 444 at a time as part of a prefetch operation. The number of bits sent at a time during a prefetch operation can be based on a number of DQs in I/O component 444 and a burst length of the memory system.

In a number of embodiments, column decode circuitry 452 can select the 8 bits stored in group 407-1 of sense amplifiers 407-1 including sense amplifiers 406-0, . . . , 406-7 and send those 8 bits to I/O component 444. After sending bits from group 407-1 to I/O component 444, multiplexer 460 can select the 8 bits stored in group 407-2 of sense amplifiers 407-1 including sense amplifiers 406-8, . . . , 406-15 and send those 8 bits to I/O component 444. After sending bits from group 407-2 to I/O component 444, column decode circuitry 452 can continue select groups of sense amplifiers until bits from group 407-M including sense amplifiers 406-X−8, . . . , 406-X−1 are sent to I/O component 444.

In a number of embodiments, column decode circuitry 452 can select 8 bits stored in sense amplifiers with each of the 8 bits stored in different groups to first send to I/O component 444. For example, a first bit of the 8 bits can be from a first sense amplifier of a first group (e.g., sense amplifier 406-0 of group 407-1), a second bit of the 8 bits can be from a first sense amplifier of a second group (e.g., sense amplifier 406-8 of group 407-8), and so on until a final bit of the 8 bits is from a first sense amplifier of an eight group (not shown). After sending the bits from a first sense amplifier of 8 groups of sense amplifiers, column decode circuitry 452 can continue to select 8 bits from a second sense amplifier of the 8 groups of sense amplifiers.

In FIG. 4, I/O component 444 can receive bits of data and the bits of data can be written to sense amplifiers 406-0, . . . , 406-X−1 in a particular order. The column decode circuitry 452 can receive bits of data from I/O component 444 select the sense amplifiers 406-0, . . . , 406-X−1 such that data is written to the sense amplifiers 406-0, . . . , 406-X−1 in a particular order. In FIG. 4, the column decode circuitry 452 can be configured to send 8 bits at time from the I/O component 444 to sense amplifiers 406-0, . . . , 406-X−1. Although, embodiments are not limited to 8 bits and any number of bits can be sent from the I/O component 444 to sense amplifiers 406-0, . . . , 406-X−1 at a time as part of a write operation. For example, 8, 32, 64, and/or 128 bits, among other numbers of bits, can be sent to I/O component 444 at a time as part of a write operation. The number of bits sent at a time during a write operation can be based on a number of DQs in I/O component 444 and a burst length of the memory system.

In a number of embodiments, column decode circuitry 452 can select the sense amplifiers in group 407-1 include sense amplifiers 406-0, . . . , 406-7 and to receive the first 8 bits of data and the first 8 bits can be written to group 407-1. After writing the first 8 bits to the sense amplifiers in group 407-1, column decode circuitry 452 can select the sense amplifiers in group 407-2 include sense amplifiers 406-8, . . . , 406-15 and to receive the second 8 bits of data and the second 8 bits can be written to group 407-2. After sending bits to the sense amplifiers in group 407-2, column decode circuitry 452 can continue select groups of sense amplifiers to receive bits until bits from group 407-M including sense amplifiers 406-X−8, . . . , 406-X−1 have received 8 bits of data, which may correspond to the final 8 bits in a write command.

In a number of embodiments, column decode circuitry 452 can select 8 sense amplifiers with each of the sense amplifiers in different groups. For example, a first sense amplifier of the first group (e.g., sense amplifier 406-0 of group 407-1) can receive a first bit of 8 bits, a first sense amplifier of the second group (e.g., sense amplifier 406-8 of group 407-2) can receive a second bit of 8 bits, and so on until a first sense amplifier of an eight group (not shown) receive an eight bit of 8 bits. After sending the bits to a first sense amplifier of 8 groups of sense amplifiers, column decode circuitry 452 can continue to select second sense amplifiers from the 8 groups of sense amplifiers and/or select another 8 groups of sense amplifiers and select sense amplifiers from those 8 groups to send bits of data. The column decode circuitry 452, according to embodiments of the present disclosure, can select the sense amplifiers to receive the bits of data in any order and can select any number of sense amplifiers at a given time to receive bits of data.

Figure 5:
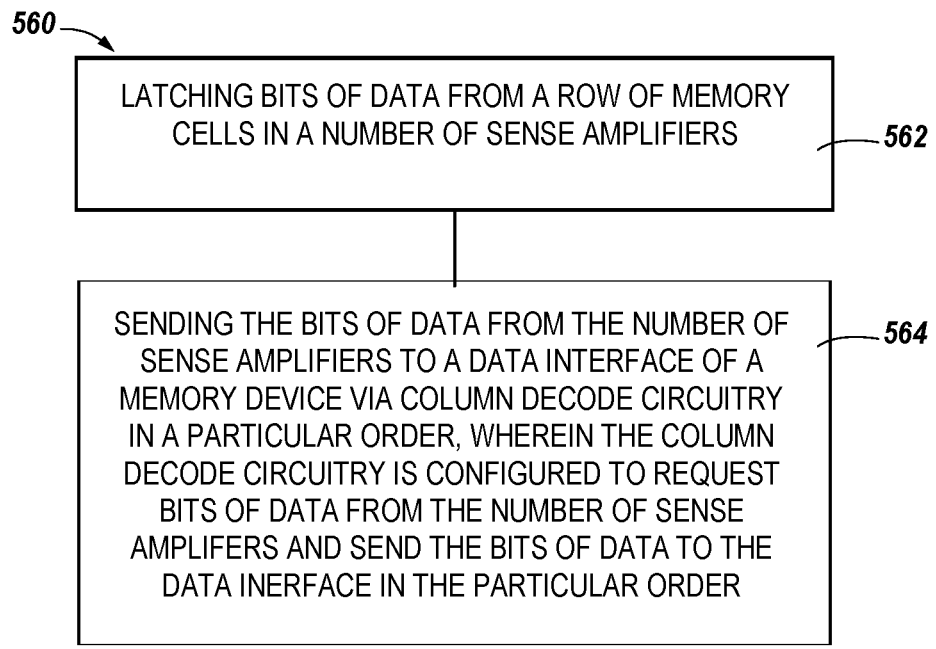
FIG. 5 is a flow diagram of an example method to perform a read operation in accordance with a number of embodiments of the present disclosure.

FIG. 5 is a flow diagram of an example method to perform a read operation in accordance with a number of embodiments of the present disclosure. FIG. 5 is a flow diagram of an example method 560 to perform a read operation. Method 560 can be performed by the apparatuses and system described above in association with FIGS. 1-4. Although the method is shown in a particular sequence or order, unless otherwise specified, the order of the processes can be modified. Thus, the illustrated implementations should be understood only as examples, and the illustrated processes can be performed in a different order, and some processes can be performed in parallel. Additionally, one or more processes can be omitted in various embodiments. Thus, not all processes are required in every implementation. Other process flows are possible.

At block 562, the method 560 may include latching bits of data from a row of memory cells in a number of sense amplifiers At block 564, the method 560 may include sending the bits of data from the number of sense amplifiers to a data interface of a memory device via column decode circuitry in a particular order, wherein the column decode circuitry is configured to request bits of data from the number of sense amplifiers and send the bits of data to the data interface in the particular order.

Figure 6:
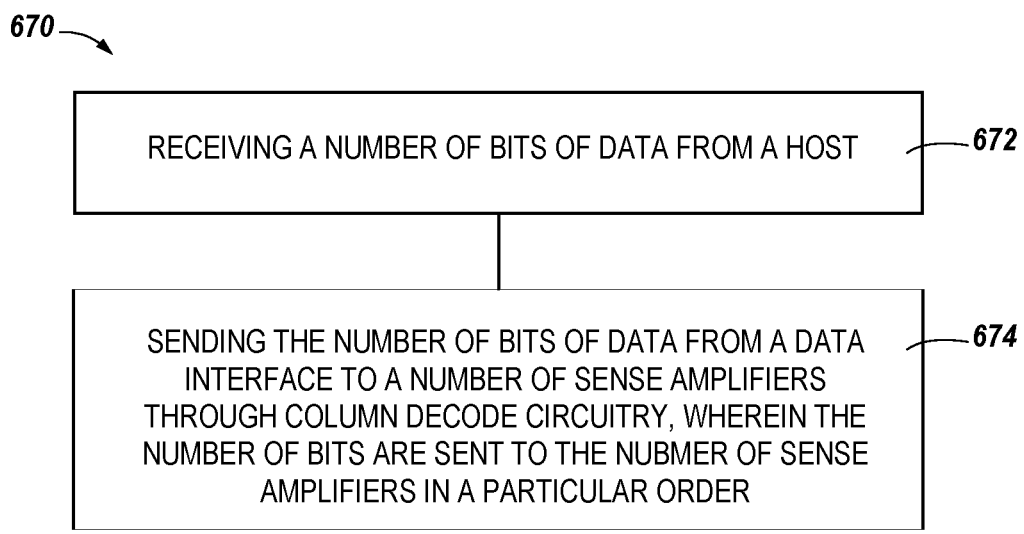
FIG. 6 is a flow diagram of an example method to perform a write operation in accordance with a number of embodiments of the present disclosure.

FIG. 6 is a flow diagram of an example method to perform a write operation in accordance with a number of embodiments of the present disclosure. FIG. 6 is a flow diagram of an example method 670 to perform a write operation. Method 670 can be performed by the apparatuses and system described above in association with FIGS. 1-4. Although the method is shown in a particular sequence or order, unless otherwise specified, the order of the processes can be modified. Thus, the illustrated implementations should be understood only as examples, and the illustrated processes can be performed in a different order, and some processes can be performed in parallel. Additionally, one or more processes can be omitted in various embodiments. Thus, not all processes are required in every implementation. Other process flows are possible.

At block 672, the method 670 may include receiving a number of bits of data from a host.

At block 674, the method 670 may include sending the number of bits of data from a data interface to a number of sense amplifiers through column decode circuitry, wherein the bits are sent to the number of sense amplifiers in a particular order.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
an array of memory cells;
a data interface;
a column decode circuitry coupled between the array of memory cells and the data interface; and
a controller coupled to the array of memory cells, the controller configured to cause the apparatus to:
latch bits associated with a row of memory cells in the array in to a number of sense amplifiers in an activate operation; and
send the bits from the sense amplifiers to the data interface via the column decode circuitry in a first particular order that corresponds to a first particular matrix configuration, wherein the bits are sent such that the bits correspond to a particular row of the matrix configuration from adjacent sense amplifiers.

2. The apparatus of claim 1, wherein the first particular order corresponds to a command from a host request for the bits in the first particular matrix configuration.

3. The apparatus of claim 1, wherein the column decode circuitry is configured to send the bits to the data interface in the first particular order.

4. The apparatus of claim 1, wherein the controller is configured to cause the apparatus to:
receive data from a host; and
send bits corresponding to the data from the data interface to the number of sense amplifiers through the column decode circuitry.

5. The apparatus of claim 4, wherein the controller is further configured to cause the apparatus to write the bits in a row of the array of memory cells.

6. The apparatus of claim 4, wherein the controller is configured to cause the apparatus to send the bits to the sense amplifiers in a second particular order indicated by the host in a write command.

7. The apparatus of claim 6, wherein the column decode circuitry is configured to send the bits in to the number of sense amplifiers in the second particular order.

8. The apparatus of claim 6, wherein the second particular order corresponds to a second particular matrix configuration.

9. A method, comprising:
latching bits of data from a row of memory cells in a number of sense amplifiers; and sending the bits of data from the number of sense amplifiers to a data interface of a memory device via column decode circuitry in a particular order based on a matrix configuration, wherein the column decode circuitry is configured to request bits of data from the number of sense amplifiers and send the bits of data to the data interface in the particular order, wherein sending the bits of data in the particular order comprises:
sending bits of data from a first group of sense amplifiers that are adjacent to each other; and
sending bits of data from a second group of sense amplifiers that are adjacent to each other.

10. The method of claim 9, further comprising:
receiving a command from a host indicating the particular order, wherein the bits of data are sent in the particular order based at least in part on the command.

11. The method of claim 10, further comprising:
signaling the column decode circuitry to send particular bits of data to the data interface in response to the command received from the host.

12. The method of claim 9, wherein sending the bits of data in the particular order comprises:
sending bits of data from every eighth sense amplifier starting with a first sense amplifier; and
sending bits of data from every eighth sense amplifier starting with a second sense amplifier.

13. The method of claim 9, wherein sending the bits of data in the particular order comprises:
sending a portion of the bits of data that corresponds to data in the matrix configuration.

14. A method, comprising:
receiving a number of bits of data from a host; and
sending the number of bits of data from a data interface to a number of sense amplifiers through column decode circuitry, wherein the bits are sent to the number of sense amplifiers in a particular order such that the bits of data correspond to a matrix configuration and wherein sending the number of bit of data in the particular order comprises sending bits that correspond to a particular row of the matrix configuration to adjacent sense amplifiers.

15. The method of claim 14, wherein the particular order comprises:
sending the bits of data sequentially to adjacent sense amplifiers based on a burst length of a write operation.

16. The method of claim 14, wherein the particular order comprises:
sending the bits of data sequentially to sense amplifiers that are a particular distance from each other based on a burst length of a write operation.

17. The method of claim 14, wherein sending the number of bit of data in the particular order comprises:
sending bits that correspond to a particular column of the matrix configuration to adjacent sense amplifiers.

18. The method of claim 14, wherein sending the number of bit of data in the particular order comprises:
sending bits that correspond to a particular diagonal of the matrix configuration to adjacent sense amplifiers.

* * * * *

UNITED STATES PATENT AND TRADEMARK OFFICE
CERTIFICATE OF CORRECTION

PATENT NO. : 11,269,648 B2
APPLICATION NO. : 17/065749
DATED : March 8, 2022
INVENTOR(S) : Glen E. Hush et al.

It is certified that error appears in the above-identified patent and that said Letters Patent is hereby corrected as shown below:

In the Claims

Claim 1 should read:
1. An apparatus, comprising:
 an array of memory cells;
 a data interface;
 a column decode circuitry coupled between the array of memory cells and the data interface; and
 a controller coupled to the array of memory cells, the controller configured to cause the apparatus to:
  latch bits associated with a row of memory cells in the array in a number of sense amplifiers in an activate operation; and
  send the bits from the sense amplifiers to the data interface via the column decode circuitry in a first particular order that corresponds to a first particular matrix configuration, wherein the bits are sent such that the bits correspond to a particular row of the matrix configuration from adjacent sense amplifiers.

Signed and Sealed this
Seventh Day of March, 2023

Katherine Kelly Vidal
*Director of the United States Patent and Trademark Office*